United States Patent
Okunuki

(10) Patent No.: US 6,465,797 B2
(45) Date of Patent: *Oct. 15, 2002

(54) ELECTRON BEAM ILLUMINATION APPARATUS, ELECTRON BEAM EXPOSURE APPARATUS, AND DEVICE MANUFACTURING METHOD

(75) Inventor: Masahiko Okunuki, Akiruno (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/457,083

(22) Filed: Dec. 7, 1999

(65) Prior Publication Data

US 2002/0020822 A1 Feb. 21, 2002

(30) Foreign Application Priority Data

Dec. 8, 1998 (JP) ............................. 10-349021

(51) Int. Cl.[7] ............................. A61N 5/00; G21G 5/00
(52) U.S. Cl. ................................. 250/492.3
(58) Field of Search ................ 250/492, 398, 250/492.23, 492.3

(56) References Cited

U.S. PATENT DOCUMENTS

| | | | | |
|---|---|---|---|---|
| 4,167,676 A | * | 9/1979 | Collier | 250/492 |
| 4,663,559 A | * | 5/1987 | Christensen | 313/336 |
| 4,904,895 A | | 2/1990 | Tsukamoto et al. | 313/336 |
| 6,037,601 A | | 3/2000 | Okunuki | 250/492.23 |
| 6,246,065 B1 | * | 6/2001 | Goto | 250/492.23 |

FOREIGN PATENT DOCUMENTS

| | | |
|---|---|---|
| JP | 10-135102 | 5/1998 |
| JP | 10-294255 | 11/1998 |

OTHER PUBLICATIONS

S.D. Berger et al., Projection Electron–beam Lithography: A New Approach, J. Vac. Sci. Technology. B9(6), (1991), pp. 2996–2999.

U.S. patent application Ser. No. 09/060,354 Tsukamoto et al., Electron Emission Device, filed Apr. 15, 1998.

* cited by examiner

Primary Examiner—Jack Berman
Assistant Examiner—Johnnie L. Smith, II
(74) Attorney, Agent, or Firm—Fitzpatrick, Cella, Harper & Scinto

(57) ABSTRACT

The electron emission surface of an electron source is formed to have an effective irradiation area and a restricted irradiation area the electron emission efficiencies of which differ from each other. In an electron beam exposure method, the effective irradiation area is an effective electron emission area that take part in exposure, and the restricted irradiation area is an area which does not participate directly in exposure and which emits an electron beam that, if it were not restricted, would be screened by aperture electrodes in an electron gun or illumination column.

29 Claims, 7 Drawing Sheets

ELECTRON BEAM ILLUMINATION APPARATUS, ELECTRON BEAM EXPOSURE APPARATUS, AND DEVICE MANUFACTURING METHOD

BACKGROUND OF THE INVENTION

This invention relates to an electron beam illumination apparatus used in the lithography process for the manufacture of semiconductor devices, and to an electron beam exposure system having this illumination apparatus.

An optical stepper having a high productivity has been used in the mass-production stage of semiconductor memory device manufacture. In the production of memory devices such as 1 G and 4 G DRAMs and beyond having a line width of less than 0.2 µm, however, the electron beam exposure method, which features a high resolution, is expected to be one of the exposure techniques that will replace optical exposure.

The mainstays of conventional electron beam exposure have been the single-beam Gaussian method and the variable shaping method. Because these electron beam exposure methods exhibit low productivity, they have been used in mask lithography, research and development of very large scale integration and exposure of ASIC devices manufactured in low volumes.

Thus, the challenge involved in adapting electron beam exposure methods for mass production is how to raise the productivity of these methods. One proposed solution is partial batch transfer. An exposure apparatus of the variable shaping or partial batch transfer type is shown in FIG. 8A. This apparatus includes an illumination apparatus 21 constituted by an electron gun 20 having an electron source 7b, a Wehnelt electrode 8, a ground electrode 9 and an aperture 10a, a deflector 13, a first illumination lens 11a, a second illumination lens 11b and an aperture 10b (or electron beam mask 15); and a projection lens system 22 having a projection lens 12 for projecting an electron beam, which has passed through the electron beam mask 15, onto a wafer 16 on a stage 17 via a deflector 14. An exposure system of the partial batch transfer type is particularly good method at raising exposure productivity because it is capable of reducing the number of exposure shots by dividing the repetitive portions of memory circuit patterns into cells of several microns.

Assuring exposure line-width precision at the same time as the productivity of an exposure system is an important practical factor in the exposure system. It is required that uniformity of the intensity of irradiation in an exposure area be made less than 0.5% over the entire exposure area. In order to obtain an irradiating electron beam having a high degree of uniformity, an electron beam of good characteristics in an area having an aperture angle of several milliradians is extracted as the irradiating beam, through screening by the aperture 10a, from an electron beam of tens of milliradians emitted from the electron gun (see FIG. 8B).

A method of enlarging the exposure area has recently been proposed in order to provide a further improvement in productivity. For example, SCALPEL, which is an electron beam transfer method using an electron beam scattering mask [S. D. Berger et al., "Projection electron beam lithography: A new approach", J. Vac. Sci. Technology B9, 2996, (1991)], is one method of high-speed electron beam exposure. With this method the exposure area is 2500 times larger than in the case of the conventional variable shaping method or cell exposure method and, as a result, it is possible to reduce the effects of electron interaction caused by the Coulomb effect. This makes it possible to perform exposure upon raising the irradiating electron beam current by one order of magnitude over the conventional exposure method. A high productivity is expected as a result. However, this electron beam exposure method requires a highly uniform irradiation intensity over a wide exposure area. In addition, an increase in the irradiation current is accompanied by an increase in the amount of electron beam screened by the apertures in the electron gun and illumination column after the electron beam is generated by the electron source.

With an electron beam mask projection apparatus that uses an arcuate beam (see the specification of Japanese Patent Application Laid-Open No. 10-135102), the width of the exposure area is several millimeters, which is about six times greater than in the projection exposure method (SCALPEL) mentioned above. As a result, high-speed exposure is possible by scanning exposure of the mask and wafer. In order to illuminate a wide area uniformly, however, part of the peripheral beam of the electron beam produced by the electron gun is used as an irradiating beam of the exposure in the form of a ring-shaped or arcuate beam. In particular, when use is made of an electron beam emitted from an electron gun uniformly, almost all of the emitted electron beam in the generated electron beam must be screened by the apertures in the electron gun and illumination column, and a problem that arises is that the utilized efficiency of the emitted electron beam is reduced to about 1/1000.

With conventional exposure methods, the irradiating electron beam is small in quantity and no particular problems arise even if the electron current is screened by the aperture electrodes in the electron gun and illumination column. However, with the above-described exposure method having a high productivity, the current of the irradiating electron beam on the wafer is tens of microamps, which means that exposure is performed using a current that is greater by more than one order of magnitude in comparison with the conventional exposure methods. The electron current screened by the aperture electrodes takes a large value of several milliamps.

As a consequence, with the conventional method in which the emitted electron beam is screened by the beam screening electrodes along the beam path, one problem that arises is that these electrodes rise in temperature and may fuse. Another disadvantage is that a rise in temperature within the illumination column and a charge-up phenomenon within the column caused by scattering of screened electrons can lead to a decline in the positioning precision of the irradiating electron beam, which is an important factor in exposure performance. This makes it difficult to improve throughput by increasing irradiation current. Furthermore, since the load on the power supply of the electron generating device is larger than that in the conventional electron generating device, obtaining a highly stable, inexpensive power supply is difficult.

SUMMARY OF THE INVENTION

Accordingly, an object of the present invention is to provide an electron beam illumination apparatus for eliminating the problems of the prior art, namely a decline in beam positioning precision, and for improving on efficiency with which an emitted electron beam is utilized and throughput, and reducing equipment cost, as well as an electron beam exposure system having this illumination apparatus.

According to the present invention, the foregoing object is attained by providing an electron beam illumination apparatus having an electron gun which generates electrons from an electron emission surface and accelerates the electrons for irradiating an irradiation area with an electron beam, the electron gun having a thermal-electron source and the electron emission surface of the electron source having an effective irradiation area an exposure irradiation area and a restricted irradiation area the surface of the effective irradiation area and the surface of the restricted irradiation area consisting of materials having different electron emission efficiencies.

The surface materials of the electron emission surface are characterized in that the difference between the electron emission efficiencies at the electron emission surface is a difference between work functions, with the work function of the restricted irradiation area being greater than that of the effective irradiation area by 1.0 eV or more. Further, the effective irradiation area consists of lanthanum boride having a high electron emission efficiency, and the restricted irradiation area comprises carbon, or a material containing carbon, that will not react with the material of the effective irradiation area at high temperatures. Furthermore, the effective irradiation area and the restricted irradiation area of the electron emission surface both comprise metals exhibiting a high melting point, the material of the effective irradiation area comprising a monoatomic layer of cathodic material, and the restricted irradiation area comprising tungsten, platinum or palladium.

A method of forming an electron emission layer having such a restricted irradiation area includes forming a surface layer of the restricted irradiation area by vapor deposition, ion-beam sputtering, ion plating or ion injection means, thereby forming the surface of the restricted irradiation area.

Further, the electron emission surface of the thermal-electron source of the electron beam illumination apparatus is flat in shape and has the restricted irradiation area disposed on the periphery of the surface. This arrangement is ideal for an electron beam exposure system having a planar exposure area.

Further, in an exposure scheme in which the exposure area is arcuate in shape, it is preferred that the electron emission surface have a flat shape and that the effective irradiation area be formed in the shape of a ring or partial arc on the surface. Alternatively, the electron emission surface is concave in shape, the effective irradiation area is provided in the shape of a ring or arc on the outermost surface, and the restricted irradiation area is provided on the periphery of this effective irradiation area. Alternatively, the electron emission surface is a concave or convex curved surface, the effective irradiation area is provided in the shape of a ring or arc on the surface, and the restricted irradiation area is provided on the periphery of this effective irradiation area.

In an exposure scheme in which the exposure area has different aspect ratios, it is preferred that the electron emission surface have a flat shape and that the effective irradiation area be formed on the surface in a straight line.

Furthermore, in an exposure scheme in which multiple exposure areas are exposed simultaneously by making use of multiple electron beams, it is preferred that the effective irradiation areas be dispersed over the electron emission surface.

Thus, as described above, the electron emission surface of a thermal-electron source of an electron gun is provided with an effective irradiation area and a restricted irradiation area the electron emission efficiencies of which differ. The effective irradiation area is adopted as an effective electron emission area that participates in exposure. The restricted irradiation area is adopted as an area which does not participate directly in exposure and which emits an electron beam that, if were not restricted, would be screened by the aperture electrodes in the electron gun or illumination column. As a result, the irradiation utilization efficiency of the emitted electrons can be improved. Furthermore, since the quantity of electron beams that irradiate the aperture electrodes in the illumination column is greatly reduced, the problems of the rise in temperature within the column, column charge-up and fusing of aperture electrodes caused by irradiation with the electron beam are solved. In addition, a decline in beam resolution due to electron interaction can be prevented by extracting only the necessary electron beams within the illumination column.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1A:
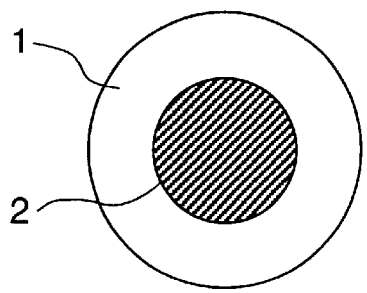
FIGS. 1A to 1H are diagrams illustrating shapes of an electron source in an electron beam illumination apparatus according to an embodiment of the present invention, wherein the electron source has an electron emission surface provided with effective and restricted irradiation areas.

An electron beam illumination apparatus according to the present invention will now be described in detail.

An example of the electron beam illumination principle will be described first.

An electron beam emitted from the electron emission surface of an electron source is accelerated and focused by an electron gun to form a crossover (see FIG. 3A, described later). In an electron beam exposure system, the angular component of the electron beam that diverges from the crossover is extracted as an irradiating electron beam for irradiating a wafer. Since the position of the electron emission surface of the electron source and the angular component of the electron beam that diverges from the crossover substantially correspond. So, this correspondence can be established between the irradiating electron beam that participates in exposure and the position of the electron emission surface of the thermal-electron source.

Accordingly, the electron emission surface is provided with an effective irradiation area and a restricted irradiation area. Hence, an effective electron emission area that participates in exposure at the electron emission surface is adopted as the effective irradiation area of the electron emission surface, and an area which does not participate directly in exposure and which emits an electron beam that, if it were not restricted, would be screened by the aperture electrodes in the electron gun or illumination column is adopted as the restricted irradiation area of the electron emission surface. By arranging it so that there is a difference between the electron emission efficiency of the effective irradiation area and the electron emission efficiency of the restricted irradiation area of the electron emission surface, the irradiation utilization efficiency of the emitted electrons can be raised.

More specifically, a difference is provided between the electron emission efficiencies of the effective and restricted irradiation areas by providing a difference between the work functions of the electron emission surface.

The current density of electrons emitted from an source of thermal electrons is derived from the Richardson equation:

$$J = AT^2 \exp(-W/kT)$$

where J represents the current density, A a constant in the Richardson equation, T the absolute temperature of a thermal cathode, W the work function of the cathode surface, and k the Boltzman constant.

If we let Wa represent the work function of the effective irradiation area, which has a high electron emission efficiency, let Wb represent the work function of the restricted irradiation area, which has a low electron emission efficiency, and let the difference between the work functions of these two areas represent $$\Delta W = Wb - Wa.$$

The ratio R between the electron emission efficiencies of both areas can be obtained as follows:

$$R = J_b / J_a = \exp(-\Delta W)$$

By way of example, assume a case where a boride compound (e.g., $LaB_6$) is used as the material having the high electron emission efficiency in the effective irradiation area of the electron emission surface, and carbon is used as the material having the low electron emission efficiency in the restricted irradiation area. The work function for $LaB_6$ is approximately 2.7 eV and that of carbon is approximately 4.7 eV. The difference between the work functions of these two areas, therefore, is $$\Delta W = (W_C - W_{LaB6}) = 2.0 \text{ eV}$$

and the ratio of the electron emission efficiencies of the two areas is $$R = J_C / J_{LaB6} = 0.14$$

Thus, an effective difference can be provided between the electron emission efficiencies of the effective irradiation area and restricted irradiation area. Moreover, since carbon will not react with $LaB_6$ even at high temperatures and is highly stable, it is possible to provide an apparatus have a high degree of thermal stability.

Consider as another example a case where a metal exhibiting a high melting point is used as the source of thermal electrons. If Th–W serving as a monoatomic-layer cathode is used as the material of the effective irradiation area of the electron emission surface and carbon is used as the material of the restricted irradiation area, the difference between the work functions of the two areas will be as follows since the work function of Th–W is 2.63 eV:

$$\Delta W = (W_C - W_{Th-W}) = 1.4 \text{ eV}$$

and the ratio of the electron emission efficiencies of the two areas is $$R = J_C / J_{Th-W} = 0.07.$$

Thus it will be understood that using even a metal material having a high melting point as the source of thermal electrons is effective.

Further, even if the high-melting-point materials Th–W (whose work function is 2.63 eV) and W (whose work function is 4.5 eV) are applied as the materials of the effective irradiation area and restricted irradiation area, respectively, the fact that $\Delta W$ is 1.87 eV means that this is an effective combination. Examples of other combinations of materials other than Th–W serving as a monoatomic-layer cathode are Zr–W (whose work function is 3.14 eV), Th–$W_2$C (whose work function is 2.18 eV), Zr–W (whose work function is 3.14 eV), Th–$W_2$C (whose work function is 2.18 eV), Cs–W (whose work function 1.4 eV), and Ba–W (whose work function is 1.63 eV).

Further, a high-melting-point material such as Pt (whose work function is 5.3 eV) or Pd (whose work function is 4.8 eV) can also be used instead of W.

In other words, it will be understood that in order to make the ratio of the electron emission efficiencies less than 0.4, the difference $\Delta W$ between the work functions of the electron emission surface should be set to be equal to or greater than 1.0 eV.

(Embodiment)

Described next with reference to the drawings will be the shape of an electron emission surface according to the present invention applied to an exposure area in an electron beam exposure method, the characteristics of the surface and an example of an apparatus to which the surface is applied.

Figure 1B:
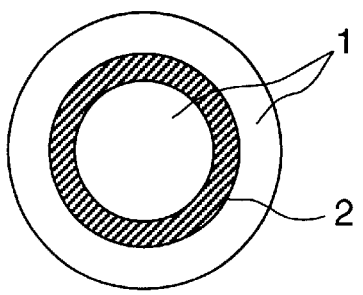
Figure 1C:
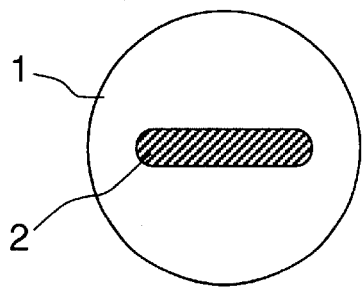
Figure 1D:
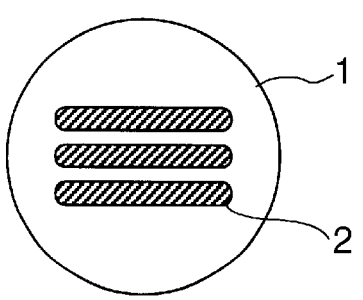
Figure 1E:
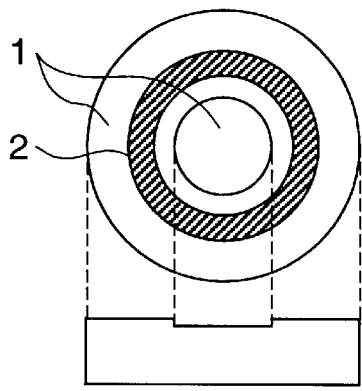
Figure 1F:
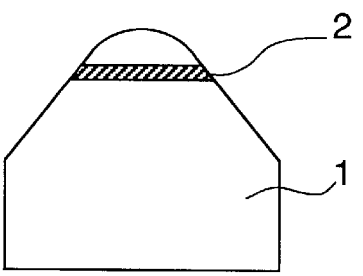
Figure 1G:
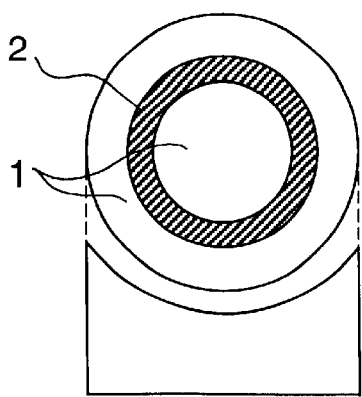
Figure 1H:
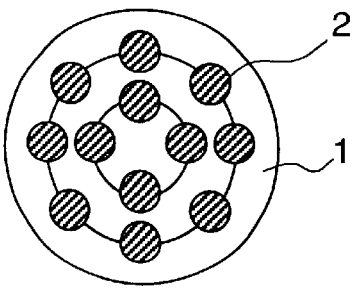

FIGS. 1A to 1H are diagrams illustrating shapes of an electron source the electron emission surface of which has an effective irradiation area and a restricted irradiation area. The electron source is used in an electron beam exposure method. In particular, FIGS. 1A to 1D and FIG. 1H illustrate examples in which an electron emission surface comprising a flat surface is formed to have a restricted irradiation area 1. FIGS. 1E to 1G illustrate examples in which the electron emission surface has been worked to form concave and convex surfaces. An effective irradiation area 2, which is the area of the electron emission surface from which the restricted irradiation area 1 is excluded, has the shape of a circle in a plane as shown in FIG. 1A, the shape of a ring in a plane as shown in FIG. 1B, the shape of a straight line in a plane as shown in FIG. 1C, the shape of a plurality of straight lines in a plane as shown in FIG. 1D, the shape of a ring on a concave surface as shown in FIG. 1E, the shape of a ring on a convex curved surface as shown in FIG. 1F, the shape of a ring on a concave curved surface as shown in FIG. 1G, and the shape of a number of dispersed points on a plane as shown in FIG. 1H.

Among the electron sources having the electron emission surfaces of these various shapes, the example shown in FIG. 1A is suitable for application to an exposure method that uses a planar beam as the exposure beam. The electron sources having the ring-shaped effective irradiation area 2 shown in FIGS. 1B, 1E, 1F and 1G are suitable for application to an exposure method that uses an arcuate beam. The electron source having the line-shaped effective irradiation area 2 shown in FIG. 1C is suitable for application to an exposure method in which the aspect ratios of the exposure area differ. The electron sources of FIGS. 1D and 1H, in which the effective irradiation area 2 is dispersed, is suitable for an exposure method in which a plurality of exposure areas are exposed simultaneously by making use of multiple electron beams.

FIGS. 2A to 2E are diagrams useful in describing a an example of a production process for forming a restricted irradiation area on the above-mentioned electron emission surfaces. These diagrams illustrate a case where the restricted irradiation area of the electron source shown in FIG. 1B is formed. An $LaB_6$ single crystal (100) having a surface size of 0.5 to 2 mm in terms of diameter is used as the material of the effective irradiation area of the electron source. As shown in FIGS. 2A to 2E, the device can be formed by a method similar to that used in a semiconductor process. More specifically, the surface of an $LaB_6$ single crystal 3 is coated with a resist 4, the resist 4 is patterned into the desired shape of the restricted irradiation area and the unnecessary portions of the resist 4 are removed to leave a resist pattern 5 on the surface of the $LaB_6$ single crystal 3. The surface of the $LaB_6$ single crystal 3 and the resist pattern 5 are then coated with a material 6 having a low electron emission efficiency. The resist pattern 5 is then peeled off.

Figure 2A:
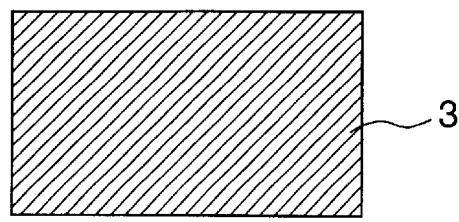
FIGS. 2A to 2E are diagrams useful in describing an example of a production process for forming a restricted irradiation area on the electron emission surface of an electron source in an electron beam illumination apparatus according to an embodiment of the present invention.
Figure 2B:
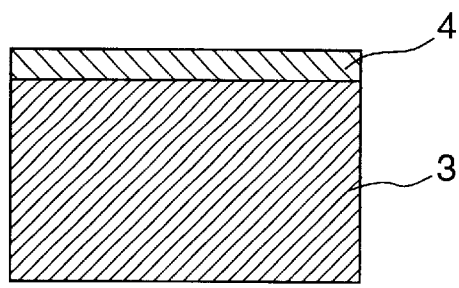
Figure 2C:
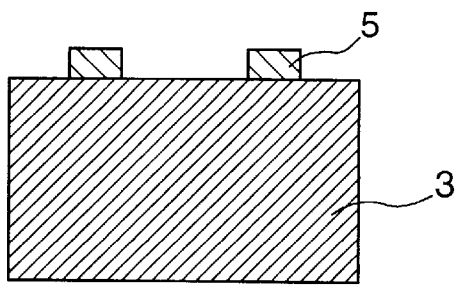
Figure 2D:
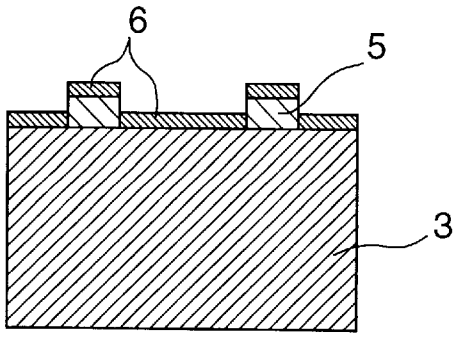
Figure 2E:
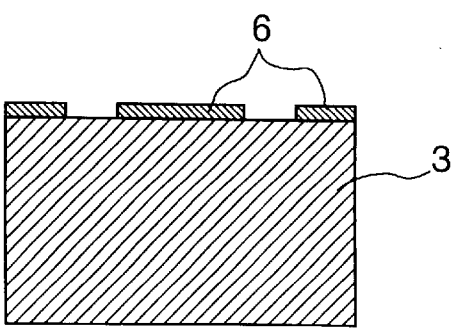

At step 2D shown in FIG. 2D, the electron emission surface is coated with carbon in the shape of the restricted irradiation area. Examples of methods of forming the surface material on the electron source are the vacuum deposition method, sputtering method, ion plating method and CVD (Chemical Vapor Deposition). Since the purpose of the coating film is to change the work function of the electron emission surface, a satisfactory characteristic can be obtained by making the film thickness very small, e.g., on the order of several nanometers to tens of nanometers. Since such a film thickness will not disturb the distribution of the electrostatic field formed on the electron emission surface of the electron source, the trajectories of the emitted electrons will not be affected.

In another method of surface formation, the work function can be raised by injecting carbon ions having a low energy of about 60 keV into the surface of the $LaB_6$. This technique for improving the electron emission surface by ion injection results in a stable surface state. As a result, this method is preferred among the above-described methods of surface formation in that a stable, long-lifetime characteristic is obtained and because no step is produced at the boundary of the effective irradiation area and restricted irradiation area, the absence of the step meaning that the trajectories of the emitted electrons will not be affected by the boundary.

Figure 3A:
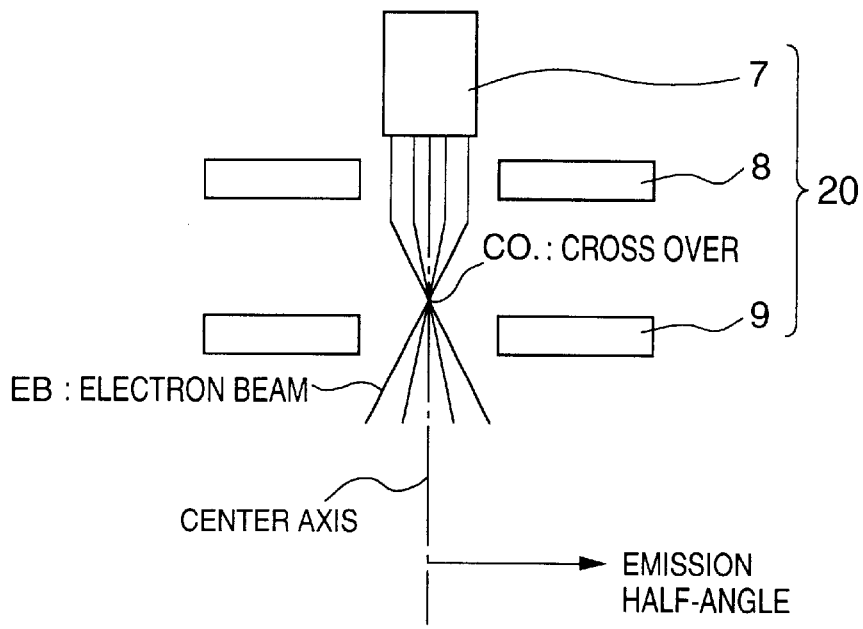
FIG. 3A is a diagram useful in describing the characteristics of an electron gun when the electron source of the electron beam illumination apparatus according to the embodiment of the present invention is applied to an exposure method.
Figure 3B:
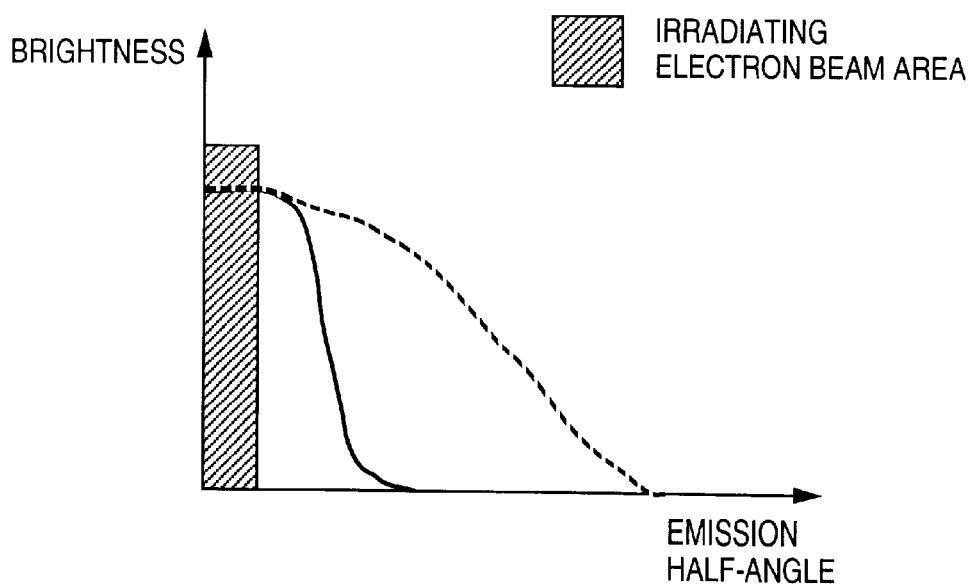
FIG. 3B is a diagram showing the characteristic of an electron gun when the electron source of FIG. 1A is applied, this diagram illustrating schematically the path of an electron that has been emitted from the electron emission surface of an electron source according to the embodiment of the present invention.

FIGS. 3A and 3B are diagrams useful in describing the characteristics of an electron gun when the above-described electron source is applied to an exposure method. FIG. 3A illustrates schematically the paths of electrons emitted from the electron emission surface of the electron source. An electron source 7a is a planar electron source from which emitted electrons are accelerated and focused by a Wehnelt electrode 8 and ground electrode 9, etc., which construct an electron gun 20, to thereby form a crossover CO. At the same time, the electrons radiate from the electron gun 20 at a certain emission angle. Thereafter, the electron beam used in electron beam exposure is screened and shaped by aperture electrodes in the electron gun and illumination column in order to obtain an area having a high uniformity from the center of the emitted electron beam.

FIG. 3B illustrates the characteristic of an electron gun when the electron source of FIG. 1A is used as the electron source for planar exposure. In order to improve the uniformity of electron beam irradiation intensity in the exposure area, the emitted electron beam used in planar exposure is one having excellent characteristics in which the aperture angle is several milliradians from the center axis. The angular distribution characteristic of emitted electrons in the conventional case where there is no restricted irradiation area is indicated by the dotted line in FIG. 3B. Here an emission half-angle having ½ the intensity distribution possesses an aperture angle of about 50 mrad. By contrast, in an electron source according to the present invention, the electron emission surface is provided with the restricted irradiation area, as a result of which the emission half-angle can be made about 10 mrad, as shown by the angular distribution characteristic indicated by the solid line in FIG. 3B.

Figure 4:
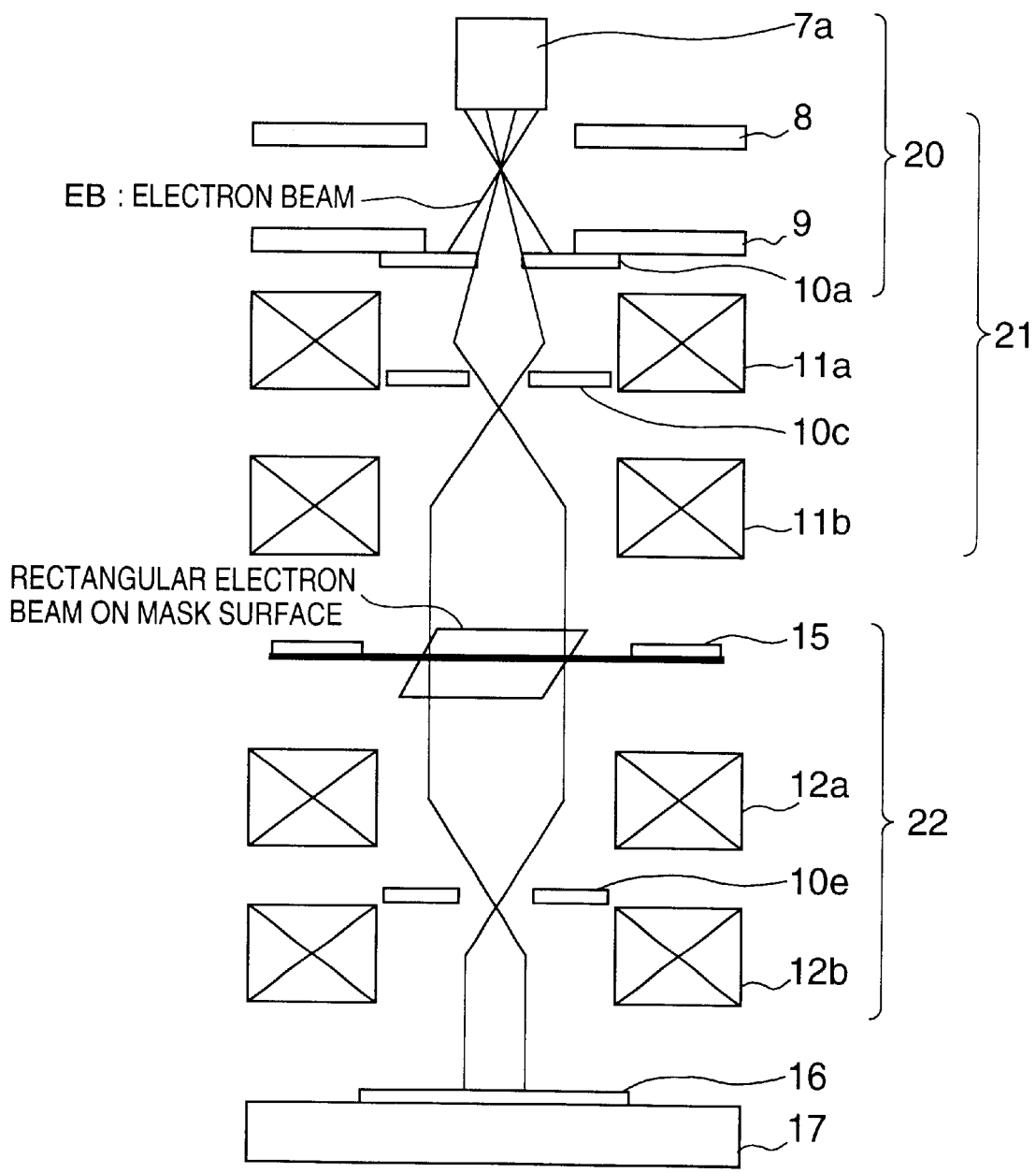
FIG. 4 is a diagram illustrating an example of an electron beam mask transfer exposure system having an electron beam illumination apparatus which radiates a planar electron beam according to the embodiment of the present invention.

FIG. 4 illustrates an example of an electron beam mask transfer exposure system using the above-described planar electron beam. The exposure system shown in FIG. 4 includes illumination apparatus 21 constituted by electron gun 20, aperture 10a, which is for obtaining an intensity area of high uniformity from the emitted electron beams, first illumination lens 11a, second illumination lens 11b and a rectangular aperture 10c for forming a rectangular electron beam SB on electron beam mask 15 by screening the electron beams; and projection lens system 22 having a first projection lens 12a for passing an electron beam, which has passed through the electron beam mask 15 into an aperture 10e and projecting the electron beam onto wafer 16 on stage 17, and a second projection lens 12b. According to this exposure system, the electron emission surface of the electron source is provided with the restricted irradiation area so that the electron beam EB that impinges upon the illumination apparatus 21 is restricted at the electron gun 20 (see FIG. 3B). Accordingly, the quantity of electron beam that irradiates the aperture 10c within the illumination column can be greatly reduced and, as a consequence, the problems of the rise in temperature within the illumination column, column charge-up and fusing of aperture electrodes caused by irradiation with the electron beam are solved.

Figure 5:
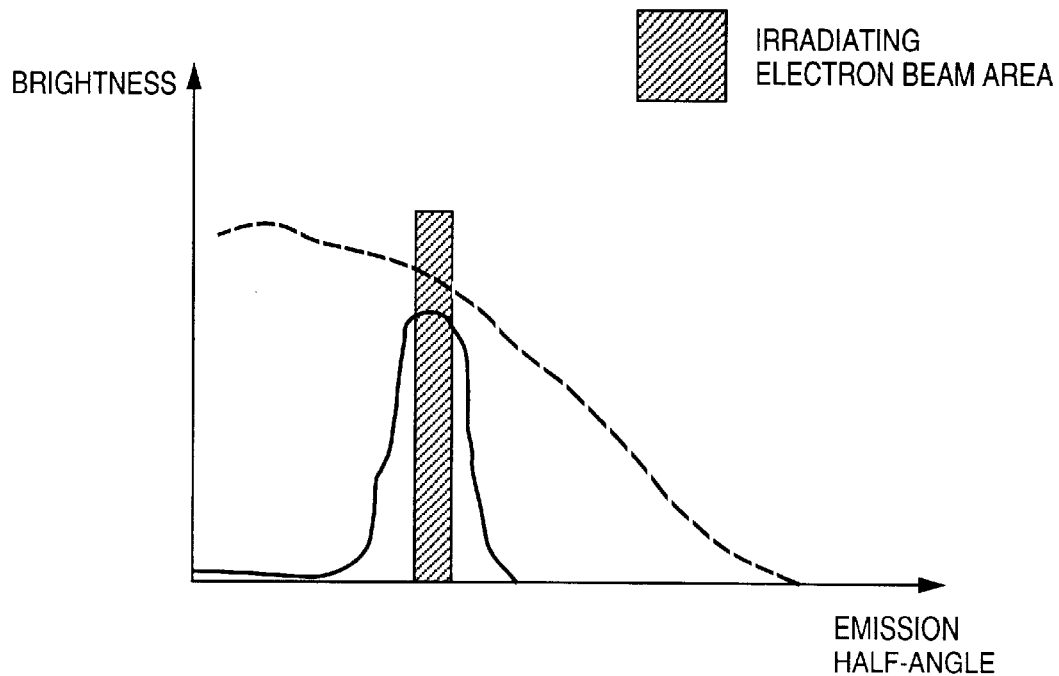
FIG. 5 is a diagram showing an angular distribution characteristic when an electron gun makes use of an electron source the electron emission surface of which is formed to have a ring-shaped effective irradiation area of the kind shown in FIG. 1B.

FIG. 5 shows the angular distribution characteristic when the electron source 7a, which has the ring-shaped effective irradiation area of the kind shown in FIG. 1B formed on the electron emission surface, is used in the electron gun 20. The solid line in this diagram indicates the characteristic of the present invention and the dotted line indicates the characteristic according to the prior art. According to the prior-art method, an irradiating electron beam is formed by cutting a ring-shaped electron beam from the electrons emitted from the entire electron emission surface. By contrast, according to the present invention, in order to constitute a ring-shaped effective irradiation area on the electron emission surface of the electron source, a restricted irradiation area is provided on the flat crystal surface. As a result, the emitted electron beam that does not participate in exposure on the inner side of the ring can be restricted at the electron emission surface and not by the apertures in the electron gun and column.

Figure 6:
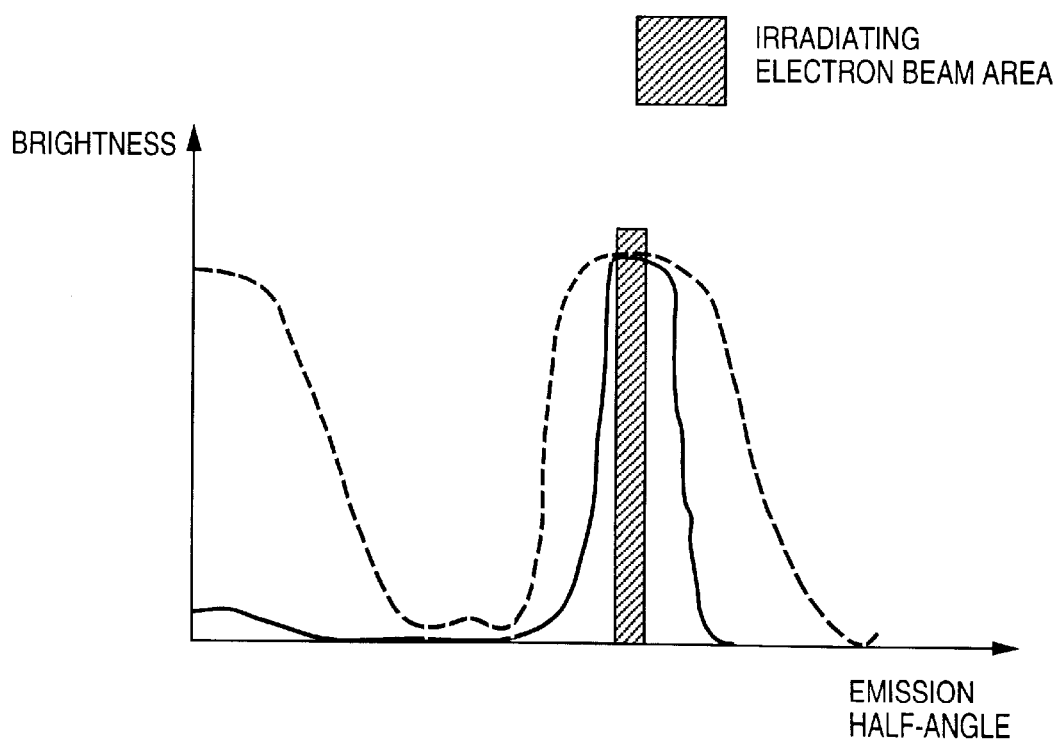
FIG. 6 is a diagram showing an angular distribution characteristic when an electron gun makes use of an electron source the concave electron emission surface of which is formed to have a ring-shaped effective irradiation area of the kind shown in FIG. 1E.

FIG. 6 is a diagram showing the angular distribution characteristic in a case where the concave shape shown in FIG. 1E is used for the electron emission surface of the electron source. This illustrates an arrangement for obtaining a further improvement in the efficiency of the ring-shaped irradiating electron beam. As indicated by the characteristic of this concave electron source, strengthening the electric field at the periphery of the electron emission surface reduces the influence of the space-charge effect and makes it possible to raise the current density. The dotted line in FIG. 6 indicates the angular distribution characteristic from an electron source not having a restricted irradiation area. The solid line indicates the angular distribution characteristic in a case where use is made of an electron source in which the concave electron emission surface shown in FIG. 1E is provided with the restricted irradiation area. Thus, forming a ring-shaped effective irradiation area on a concave electron emission surface makes it possible to improve the utilization efficiency of electrons emitted from the electron gun.

Figure 7:
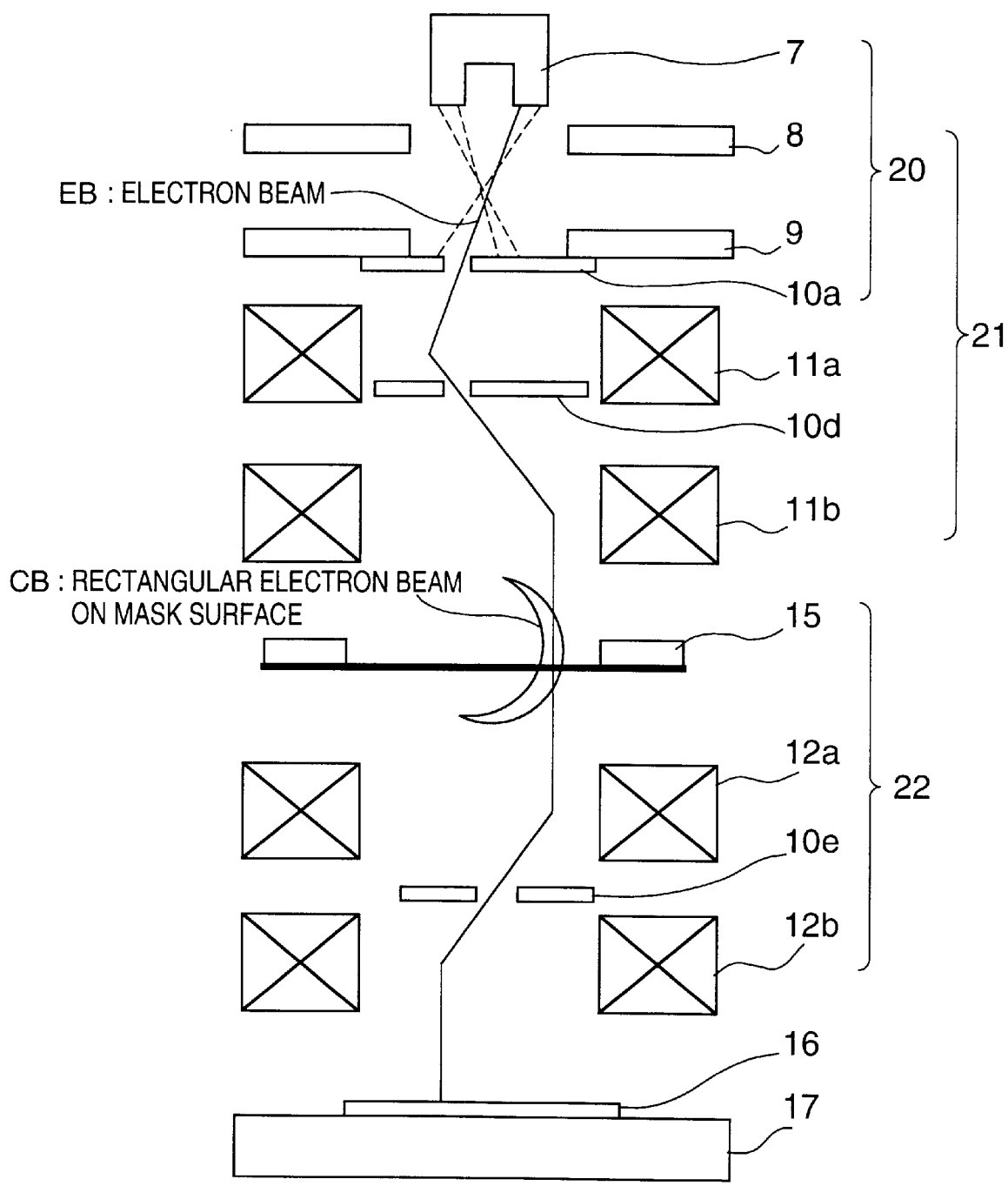
FIG. 7 is a diagram illustrating an example of an electron beam mask transfer exposure system having an electron beam illumination apparatus which radiates an arcuate electron beam according to the embodiment of the present invention.
Figure 8A:
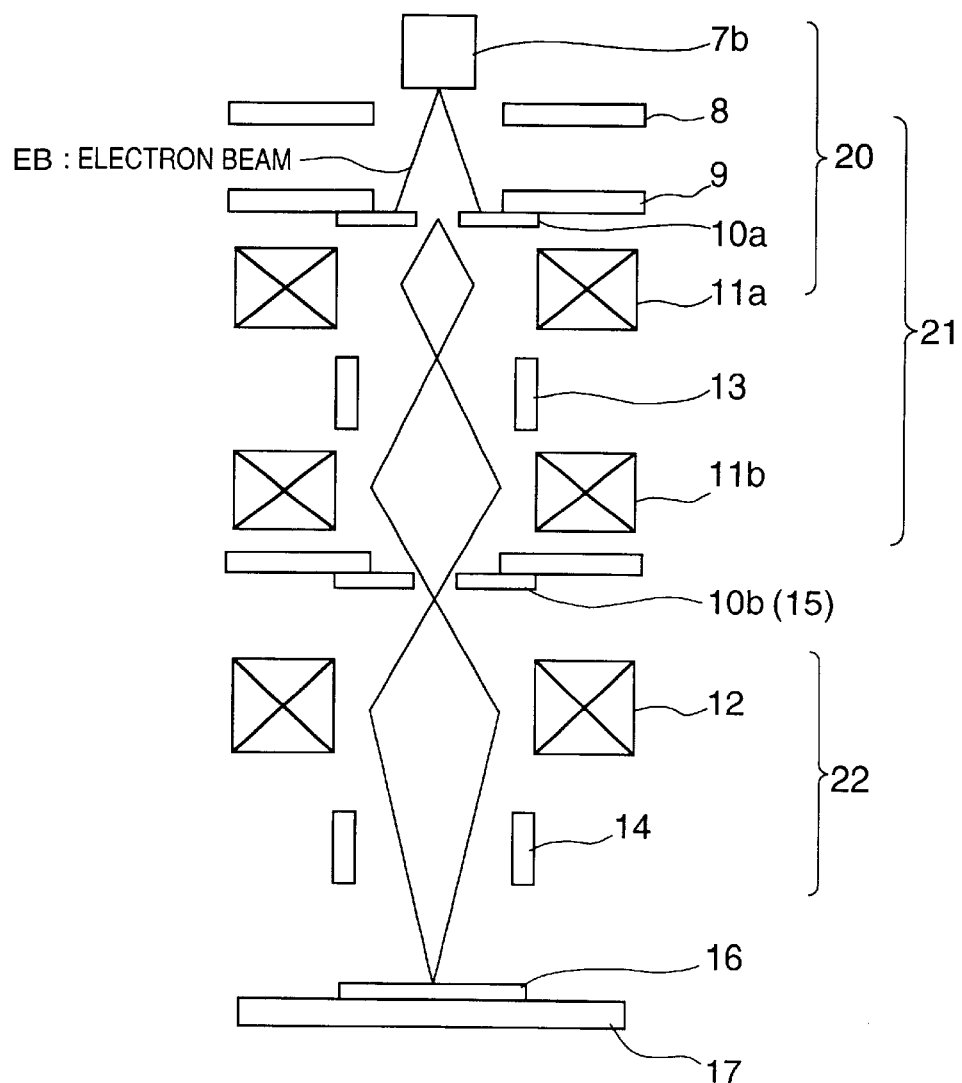
FIGS. 8A and 8B are diagrams illustrating an example of an electron beam exposure system according to the prior art.
Figure 8B:
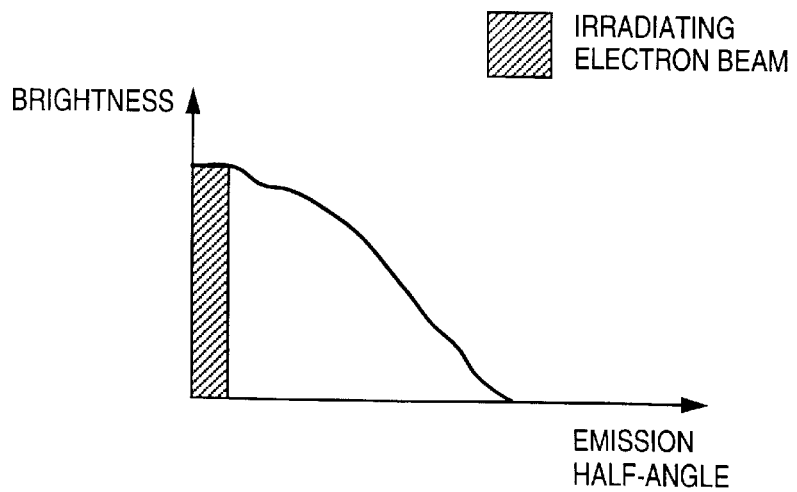

FIG. 7 is a diagram illustrating an example of an electron beam mask projection exposure system that uses the arcuate beam. The exposure system illustrated here includes illumination apparatus 21 constituted by electron gun 20, aperture 10a, which is for obtaining an intensity area of high uniformity from the emitted electron beams, first illumination lens 11a, second illumination lens 11b and an arcuate aperture 10d for forming an arcuate electron beam CB on electron beam mask 15 by screening the electron beams; and projection lens system 22 constituted by projection lenses 12a, 12b for passing an electron beam which has passed through the electron beam mask 15 into, by aperture 10e and projecting the electron beam onto wafer 16 on stage 17. In this system the arcuate beam CB formed by the illumination apparatus 21 on the mask surface is adapted in such a manner that the image of the arcuate aperture 13d is formed on the surface of the electron beam mask. The projection lens system 22 is capable of greatly reducing curvature of field aberration using the arcuate beam CB, whereby the width of the exposure area (the length of the arcuate beam) obtained when the planar electron beam shown in FIG. 4 was used can be increased by ten times or more. As a result, it is possible to achieve high-speed electron beam exposure by an irradiating beam of a large current. With this method, using the ring-shaped beam shown in FIGS. 5 and 6 makes it possible to greatly reduce the quantity of electron beam incident inside the illumination lenses. The quantity of electron beam that irradiates the arcuate aperture 10d inside the illumination column, therefore, can be greatly reduced. Accordingly, the problems of the rise in temperature within the column, column charge-up and fusing of aperture electrodes caused by irradiation with the electron beam are solved.

It should be noted that the present invention is applicable not only to the mask projection method but also to a multibeam exposure method in which a plurality of exposure areas are exposed simultaneously using a plurality of beams. In such case the electron emission surface of the electron source is provided with dispersed effective irradiation areas based upon the positions of the exposure areas, as shown in FIGS. 1D and 1H. Providing these effective irradiation areas in this manner is effective for the same reasons set forth above.

Thus, in accordance with the illustrated embodiment, as described above, the high-speed electron beam exposure system having a wide exposure area exhibits excellent efficiency in terms of utilization of the radiated electron beam produced by an electron source. Since the amount of screened beam is reduced, charge-up of the electron gun and column is reduced and the precision of the beam precision is improved. Furthermore, the temperature rise due to the shielded beam is reduced. This not only improves the thermal stability of the electron gun and column but also solves the problem of fusing of the screening electrodes. For these reasons a large irradiating current can be introduced to the exposure area, as a result of which throughput is improved. Further, since the load on the power supply of the electron generating device can be alleviated, it is possible to lower equipment cost.

As many apparently widely different embodiments of the present invention can be made without departing from the spirit and scope thereof, it is to be understood that the invention is not limited to the specific embodiments thereof except as defined in the appended claims.

What is claimed is:

1. An electron beam illumination apparatus for irradiating an irradiation area with an electron beam, said apparatus comprising:

an electron gun that includes a thermal-electron source having an electron emission surface that generates electrons, said electron emission surface including an effective irradiation area and a restricted irradiation area, wherein the electron gun accelerates electrons generated by said electron emission surface, wherein the effective irradiation area corresponds to the irradiation area being irradiated, and wherein the surface of said effective irradiation area and the surface of said restricted irradiation area consist of materials having electron emission efficiencies different from one another.

2. The apparatus according to claim 1, wherein the effective irradiation area corresponds to an exposure irradiation area.

3. The apparatus according to claim 1, wherein the difference between the electron emission efficiencies on said electron emission surface is a difference between work functions, with the work function of said restricted irradiation area being greater than that of said effective irradiation area by 1.0 eV or more.

4. The apparatus according to claim 1, wherein said effective irradiation area consists of lanthanum boride having a high electron emission efficiency, and said restricted irradiation area comprises carbon, or a material containing carbon, that will not react with the material of said effective irradiation area at high temperatures.

5. The apparatus according to claim 1, wherein said effective irradiation area and said restricted irradiation area of said electron emission surface both comprise metals exhibiting a high melting point, the material of said effective irradiation area comprises a monoatomic layer of a cathodic material, and said restricted irradiation area comprises tungsten, platinum or palladium.

6. The apparatus according to claim 3, wherein the surface of said restricted irradiation area is formed by forming the surface material of said restricted irradiation area by vapor deposition, ion-beam sputtering or ion plating.

7. The apparatus according to claim 3, wherein the surface of said restricted irradiation area is formed by forming the surface material of said restricted irradiation area by ion injection means.

8. The apparatus according to claim 1, wherein said electron emission surface defines a flat surface and said restricted irradiation area is disposed on a peripheral portion of said surface.

9. The apparatus according to claim 1, wherein said electron emission surface defines a flat surface and said effective irradiation area is formed in the shape of a ring or partial circular arc on said surface.

10. The apparatus according to claim 1, wherein said electron emission surface defines a flat surface and said effective irradiation area is formed in the shape of a straight line on said surface.

11. The apparatus according to claim 1, wherein said electron emission surface defines a concave shape, said effective irradiation area is formed in the shape of a ring or circular arc on an outermost surface, and said restricted irradiation area is formed on a peripheral portion of this effective irradiation area.

12. The apparatus according to claim 1, wherein said electron emission surface defines a convex or concave curved surface, said effective irradiation area is formed in the shape of a ring or circular arc on said surface, and said restricted irradiation area is formed on a peripheral portion of this effective irradiation area.

13. The apparatus according to claim 1, wherein said effective irradiation area is dispersed over said electron emission surface.

14. An electron beam exposure system using the electron beam illumination apparatus described in claim 1.

15. A device manufacturing method comprising:
a provision step of providing a wafer; and
an exposure step of exposing the wafer using the electron beam illumination apparatus for irradiating an irradiation area,
wherein the electron beam illumination apparatus includes:
an electron gun that includes a thermal-electron source having an electron emission surface that generates electrons, said electron emission surface including an effective irradiation area and a restricted irradiation area,
wherein the electron gun accelerates electrons generated by said electron emission surface,
wherein the effective irradiation area corresponds to the irradiation area being irradiated, and
wherein a surface of the effective irradiation area and a surface of the restricted irradiation area consist of materials having electron emission efficiencies different from one another.

16. An illumination apparatus for illuminating an illumination area with electrons, said apparatus comprising:
an electron gun having an electron emission surface that generates electrons, said electron emission surface including first and second areas having electron emission efficiencies that differ from each other; and
a system for directing electrons generated by the electron gun to the illumination area.

17. An illumination apparatus for illuminating an illumination area with electrons, said apparatus comprising:
an electron gun having an electron emission surface that generates electrons, said electron emission surface including a first area and a second area of which electron emission efficiency is smaller than that of the first area; and
a system for directing electrons generated by the electron gun to the illumination area.

18. The apparatus according to claim 17, wherein said electron gun also has an aperture restricting a part of electrons generated by the electron emission surface,
wherein electrons emitted from the first area are passed through an opening of the aperture, and
wherein electrons emitted from the second area are restricted by the aperture.

19. The apparatus according to claim 17, further comprising:
an aperture for restricting at least some of electrons generated by the electron gun,
wherein electrons emitted from the first area are passed through an opening of the aperture, and
wherein electrons emitted from the second area are restricted by the aperture.

20. The apparatus according to claim 17, wherein said electron emission surface defines any one of a flat surface, a concave surface or a convex surface.

21. The apparatus according to claim 17, wherein the second area is disposed on a peripheral portion of the first area.

22. The apparatus according to claim 21, wherein the first area is formed in a circular shape.

23. An electron beam exposure apparatus, comprising:
an illumination apparatus for illuminating an illumination area with electrons, said apparatus having:
an electron gun having an electron emission surface that generates electrons, said electron emission surface including first and second areas having electron emission efficiencies that differ from each other, and
a system for directing electrons generated by the electron gun to the illumination area; and
a projection lens system,
wherein said illumination area is illuminated by said illumination apparatus, and the electrons from said illumination area are projected on a wafer by said projection lens system.

24. An electron beam exposure apparatus, comprising:
an illumination apparatus for illuminating an illumination area with electrons, said apparatus having:
an electron gun having an electron emission surface that generates electrons, said electron emission surface including first and second areas having electron emission efficiencies that differ from each other, and
a system for directing electrons generated by the electron gun to the illumination area;
an electron beam mask having a pattern formed thereon; and
a projection lens system,
wherein said pattern of said electron beam mask is illuminated by said illumination apparatus, and the pattern is projected on a wafer by said projection lens system.

25. A device manufacturing method comprising:
a provision step of providing a wafer; and
an exposure step of exposing the wafer using an electron beam exposure apparatus,
wherein the electron beam exposure apparatus has:
an illumination apparatus for illuminating an illumination area with electrons, said illumination apparatus having:
an electron gun having an electron emission surface that generates electrons, said electron emission surface including first and second areas having electron emission efficiencies that differ from each other, and a system for directing electrons generated by the electron gun to the illumination area; and a projection lens system, wherein said illumination area is illuminated by said illumination apparatus, and the electrons from said illumination area are projected on the wafer by said projection lens system.

26. A device manufacturing method comprising:

a provision step of providing a wafer; and an exposure step of exposing the wafer using an electron beam exposure apparatus, wherein the electron beam exposure apparatus has:

an illumination apparatus for illuminating an illumination area with electrons, said illumination apparatus having:

an electron gun having an electron emission surface that generates electrons, said electron emission surface including first and second areas having electron emission efficiencies that differ from each other, and a system for directing electrons generated by the electron gun to the illumination area;

an electron beam mask having a pattern formed thereon; and a projection lens system, wherein said pattern of said electron beam mask is illuminated by said illumination apparatus, and the pattern is projected on the wafer by said projection lens system.

27. An electron gun comprising an electron emission surface having a first area and a second area, wherein said first area and said second area have electron emission efficiencies that differ from each other.

28. An electron gun comprising an electron emission surface, wherein said electron emission surface has a first area and a second area, and wherein an electron emission efficiency of said second area is smaller than that of said first area.

29. The electron gun according to claim 28, further comprising:

an aperture restricting at least some electrons generated by the electron emission surface, wherein electrons emitted from said first area are passed through an opening of the aperture, and wherein electrons emitted from said second area are restricted by the aperture.

* * * * *

UNITED STATES PATENT AND TRADEMARK OFFICE
CERTIFICATE OF CORRECTION

PATENT NO.     : 6,465,797 B2
DATED          : October 15, 2002
INVENTOR(S)    : Masahiko Okunuki It is certified that error appears in the above-identified patent and that said Letters Patent is hereby corrected as shown below:

Column 3,
Line 6, "area" (first occurrence) should read -- area, --;
Line 7, "area" should read -- area, --.

Column 7,
Line 23, "a" should be deleted.

Signed and Sealed this

Ninth Day of September, 2003

JAMES E. ROGAN
*Director of the United States Patent and Trademark Office*